United States Patent
Chang

(10) Patent No.: US 6,756,665 B1
(45) Date of Patent: Jun. 29, 2004

(54) INTEGRATED CIRCUIT PACKAGE STRUCTURE WITH HEAT DISSIPATING DESIGN

(75) Inventor: Nai-Shung Chang, Shindian (TW)

(73) Assignee: VIA Technologies, Inc, Shindian (TW)

( * ) Notice: Subject to any disclaimer, the term of this patent is extended or adjusted under 35 U.S.C. 154(b) by 0 days.

(21) Appl. No.: 10/635,564

(22) Filed: Aug. 7, 2003

(30) Foreign Application Priority Data

Jan. 15, 2003 (TW) ........................................ 92100792 A

(51) Int. Cl.[7] ............................................. H01L 23/52
(52) U.S. Cl. ........................ 257/691; 257/692; 257/693; 257/712; 257/713
(58) Field of Search ................................ 257/691–693, 257/712–713

(56) References Cited

U.S. PATENT DOCUMENTS 6,424,032 B1 * 7/2002 Ikemoto et al. ............. 257/691

* cited by examiner

*Primary Examiner*—Luan Thai
(74) *Attorney, Agent, or Firm*—Bacon & Thomas PLLC

(57) ABSTRACT

An integrated circuit (IC) package structure with heat dissipation design. The IC chip is disposed on a package substrate and a power ring structure surrounds the chip. Due to the relatively large surface area of the power ring structure near the high heat zone of the IC chip, the contact area between the power ring structure and package substrate is enlarged. The power ring structure is connected to the isoelectric conductive layer of a multi-layer circuit board via an electric connection path, thereby enhancing heat dissipation.

20 Claims, 3 Drawing Sheets

INTEGRATED CIRCUIT PACKAGE STRUCTURE WITH HEAT DISSIPATING DESIGN

BACKGROUND OF THE INVENTION

1. Field of the Invention

The present invention relates generally to the packaging of integrated circuits, and more particularly to the packaging of integrated circuits with heat-dissipating wiring.

2. Description of Related Art

During the manufacturing processes of integrated circuits, semiconductor chips are fabricated on a wafer. Upon the manufacturing processes for semiconductor are completed, the wafer is then cut to form dies, which contain semiconductor chips. Each die is a semiconductor component, such as a dynamic-random-access memory (DRAM) module or a core logic chip. Followed by the formation of dies is the packaging process of dies, which allows semiconductor components to operate independently on package substrates. The packaging process includes preparing a package substrate, which has electrical conductive lines, such as trace lines, are provided for electrically connecting to a die. Then, the die is mounted on the package substrate, wherein the bonding wires are employed to electrically connect the semiconductor component (die) to the package substrate in the case of ordinary packaging. In addition, metal bumps are employed to electrically connect the semiconductor component (die) to the package substrate in the case of flip chip packaging. After that, the encapsulating process is performed so as to package the semiconductor component onto the package substrate.

During the manufacturing processes of integrated circuits, the designs of package substrates are determined according to the electrical and dissipating requirements of the semiconductor components.

Referring to FIG. 1, a schematic diagram showing a conventional package of the core logic chip mounted on a motherboard is illustrated. A core logic chip 10 is disposed on an upper surface of a substrate 11. The core logic chip 10 connects to the signal I/O (input/output) pads of the substrate 11 via bonding wires 12, and the signal I/O pads further connects to the ball pins 14 formed on the bottom surface of the substrate 11 via through holes 13. However, since there are numerous power pins configured on the chip 10, the substrate 11 is configured with a power ring 15 for connecting to the power pins via a plurality of power wires 16. The power ring 15 further connects to the ball pins 18 formed on the bottom surface of the substrate 11 via a plurality of through holes 17, such that an electrically connection between aforementioned elements is formed. A plastic cap 19 covering the substrate 11 is mounted on the substrate 11 and serves as a protection element of the core logic chip 10. The core logic chip 10 is electrically connected to the signal I/O pads or the power ring 15 of the substrate 11 via the bonding wires 12 or the power wires 16. The core logic chip 10 is then electrically connected to the ball pins 14 and 18 via metal plugs in the through hole 13 and 17. Therefore, electrical connections to motherboard 20 are formed subsequently. By utilizing the packaging technique, the core logic chip 10 is allowed to form electrical connections to other circuit components provided on the motherboard 20.

In the above-mentioned package structure, the power ring 15 is formed on the substrate 11 and is positioned at one side of the chip 10. This may facilitate the wire bonding process for forming the power wires 16 to connect the chip 10 and the power ring 15, and simplify the design of the wire arrangement. However, the power ring 15 provided on one side of the substrate 11 will sufficiently increase the thermal stress on the substrate 11. It is because that a giant current flux flows through the power ring during the normal operation of the chip, and heat is generated. If the heat-dissipation efficiency or heat-conductive efficiency is bad, the thermal stress will occur on the substrate resulting in wrap of the substrate. In addition, the chip may become abnormal when the temperature of the substrate is too high.

Heat-dissipation efficiency has been a critical subjective in the semiconductor chips manufacturing, particularly the manufacturing of the core logic chips, which have high operating speed and integrated density. Low heat-dissipation efficiency often results in high failure frequency for integrated circuit chips. However, the drawback of employing aforementioned packaging method of the core logic chip mounted on a motherboard, wherein the core logic chip is electrically connected to the substrate via metal wires, the bottom of the core logic chip is connected to the substrate, and the substrate is connected to the motherboard with ball pads, is that such method is insufficient to satisfy higher dissipating demand required by core logic chips operation. Therefore, the subjective of the invention is to provide a solution to improve the drawback.

SUMMARY OF THE INVENTION

The invention discloses an integrated circuit package structure with heat dissipating design, wherein an integrated circuit chip is placed on a package substrate. A power ring is disposed on the substrate and around the integrated circuit chip. Parts of the power ring, neighboring the region that the integrated circuit chip would generate high heat, have larger surface areas, so as to expand the contact area between the power ring and the package substrate, and to ensure higher heat-dissipation efficiency of the integrated circuit chip.

The invention discloses the integrated circuit package structure with heat dissipating design, wherein the contact area between the power ring and the package substrate is increased, so that the package substrate conducts heat to a multi-layer circuit board via the power rings, resulting in increasing heat-dissipation efficiency of the integrated circuit chip.

The invention discloses the integrated circuit package structure with heat dissipating design, wherein the electrical connections between the substrate and a computer mother board is employed to increase the contact area of the electrical connections between the substrate and the mother board, resulting in improving the heat-dissipation efficiency.

The invention discloses the integrated circuit package structure with heat dissipating design, using a heat-dissipating metal cap provided for protecting the integrated circuit chip mounted on the package substrate, so as to increase heat-dissipation efficiency.

As mentioned above, the integrated circuit package structure of the invention has a power ring comprising a plurality of blocks, which are not connected to each other, wherein the surface area of the blocks neighboring the region that the integrated circuit chip generating more heat is larger than that of the blocks adjacent to other regions.

BRIEF DESCRIPTION OF DRAWINGS

The invention will become more fully understood from the detailed description given herein below illustration only, and thus is not limitative of the present invention, and wherein.

DETAILED DESCRIPTION OF PREFERRED EMBODIMENTS

The invention discloses an integrated circuit package structure with heat dissipating design. An integrated circuit package structure has a substrate with an upper surface and an integrated circuit chip mounted thereon. A plurality of ball pins dispose on the bottom surface of the substrate. A power ring disposes on the first surface of the substrate and around the chip, wherein the power ring is electrically connected to the chip via a plurality of power wires, and the other end of the power ring is electrically connected to the ball pins via a plurality of metal plugs through the substrate. The integrated circuit chip has a first region, in which the chip generates more heat, and a second region, in which the chip generates less heat. The power ring has a larger surface area of the region of the power ring adjacent to the first region of the integrated circuit chip than the surface area of other region of the power ring adjacent to the second region of the integrated circuit chip.

Figure 1:
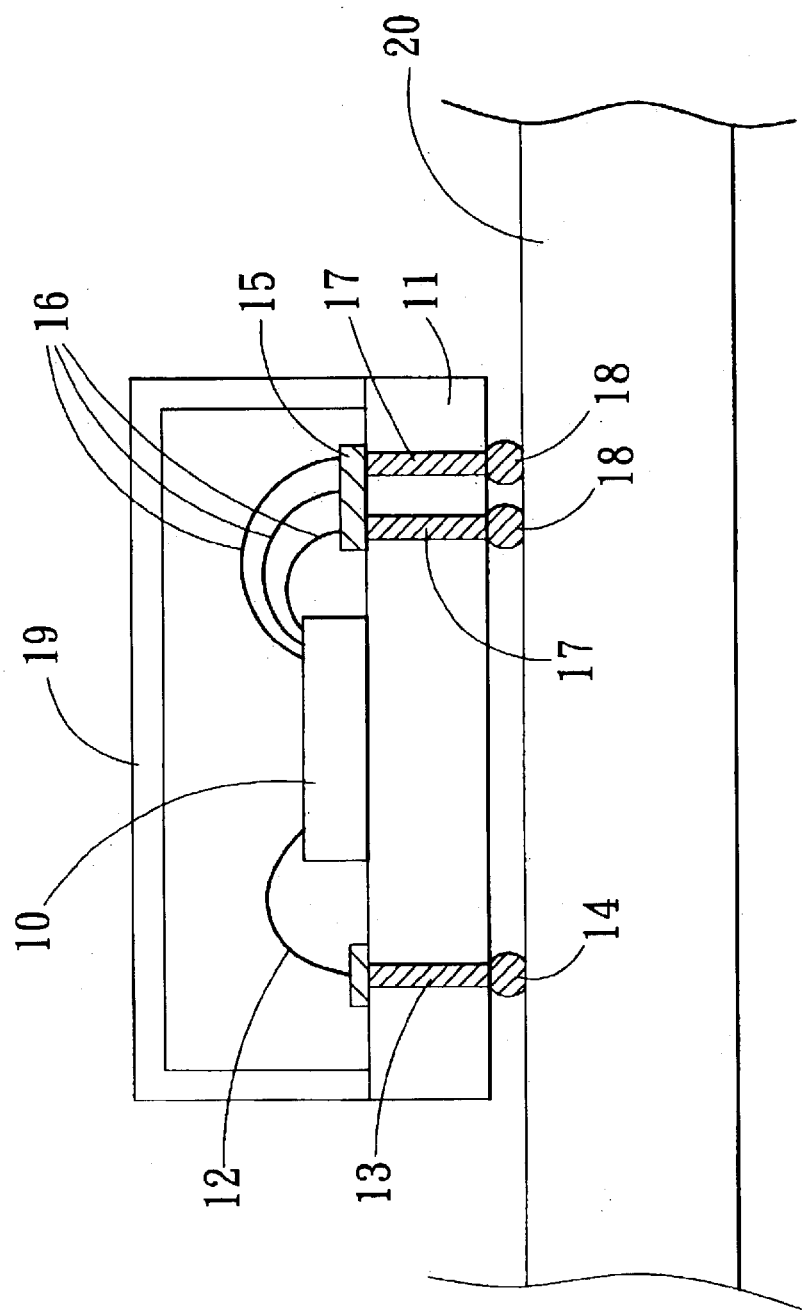
FIG. 1 shows a schematic diagram of a conventional package of the core logic chip mounted on a motherboard.
Figure 2:
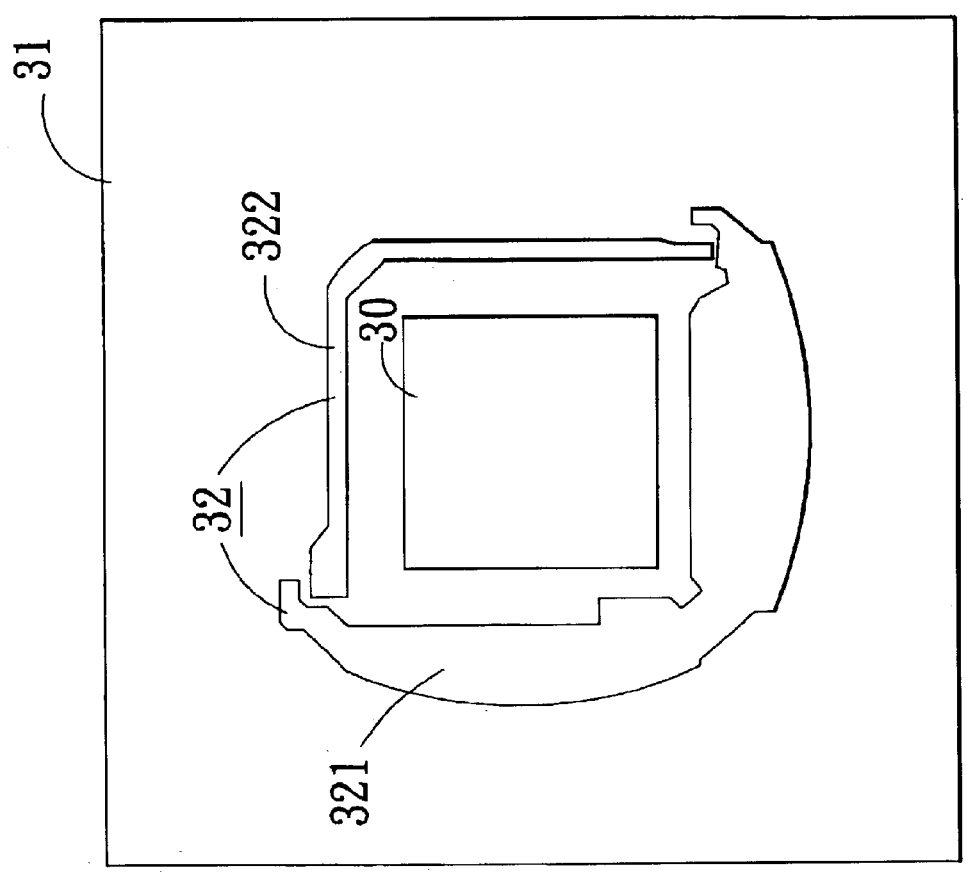
FIG. 2 is a top schematic view showing an integrated circuit package structure with heat dissipating design according to a preferred embodiment of the present invention.

Referring to FIG. 2, which shows a top schematic view showing an integrated circuit package structure with heat dissipating design according to a preferred embodiment of the present invention, a chip 30 is placed on the top surface of a substrate 31. A power ring 32 is consisted of a plurality of blocks 321, 322. In order to achieve effective heat-dissipation object, the present invention is configured to have larger surface area of block 321, neighboring the first region which the chip 30 generates more heat, than the other block 322. Such that, the left lower area of the chip, which is the first region and generates more heat, is enabled to dissipate heat effectively and maintain the chip temperature within the optimized working range.

Figure 3:
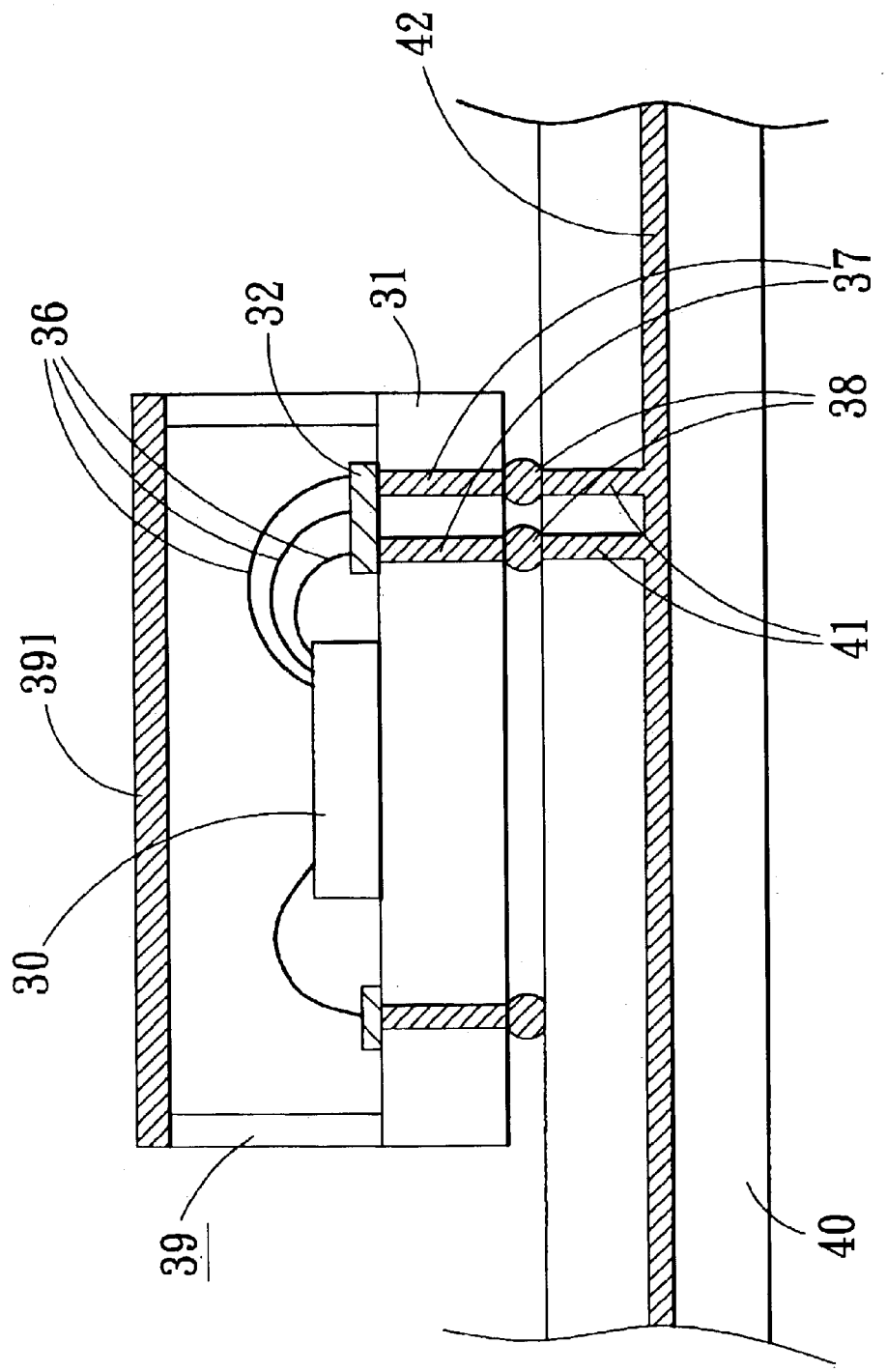
FIG. 3 is a side schematic view showing the integrated circuit package structure with heat dissipating design according to a preferred embodiment of the present invention.

With reference to FIG. 3, it shows a side schematic view showing the integrated circuit package structure with heat dissipating design according to a preferred embodiment of the present invention, wherein the chip 30 is placed on the substrate 31, and a plurality of power wires 36 are connected the chip 30 to a power ring 32 formed on the substrate 31. The power ring 32 is connected to the ball pins 38 on the bottom surface of the substrate 31 via the metal plugs provided in a plurality of through holes 37 resulting in an electrical connection. By electrically connecting the motherboard 40 with the ball pins 38, the chip 30 enables to electrically connect to other circuit components on the motherboard 40. In order to improve the heat-dissipation performance, in the present invention, metal materials (such as aluminum) is unitized to form a cap 39 for protecting the chip 30, and the cap 39 comprises a heat-dissipating metal upper cap 391. Accordingly, the heat-dissipating metal cap upper 391 enhances the heat-dissipation efficiency of the chip 30 and the entire package structure.

In addition, in order to expand heat dissipating areas, the present invention utilizes metal plugs in the through holes 41 of the multi-layer circuit board 40, to enable an electrical connection between the ball pins 38 and an isoelectric conducting layer 42 of the circuit board 40. As a result, the heat generated by the integrated circuit chip is dissipated via the isoelectric conducting layer 42. In a preferred embodiment of the present invention, the circuit board 40 is a multi-layer circuit board comprising an isoelectric conducting layer. The circuit board 40 is an ordinary computer motherboard.

The power ring 32 (referring to FIG. 3) is disposed around the chip 30. The surface area of the power ring 321 (refer to FIG. 2), neighboring the first region where more heat is generated by the chip 30 (i.e. the left bottom corner of the chip shown in FIG. 2), is expanded. As a result, the contact area between the substrate 31 and the power ring 32 is increased adjacent to the first region of the chip 30. The power ring 32 is connected to the ball pins 38 via the metal plugs in the through holes 41, and is then connected to the isoelectric conducting layer 42 of the circuit board 40 (as shown in FIG. 3), so as to increase the heat-dissipation efficiency. In other words, by expanding the surface area of the power ring neighboring the first region of the chip 30, the contact area between the power rings and the package substrate is increased. By connecting the power ring with the isoelectric conducting layer of the circuit board, the heat-dissipation efficiency of the package substrate is enhanced.

Overall, the present invention modifies conventional chip package by employing specific structure of the lower circuit board to effectively overcome the drawback of the conventional chip package. The chip of the present invention can be a core logic chip, and the multi-layer circuit board can be a computer motherboard. However, it is to be understood that the scope of the invention is not limited to the disclosed embodiments. It is intended to cover various modifications and similar arrangements. The scope of the claims, therefore, should be accorded the broadest interpretation so as to encompass all such modifications and similar arrangements.

What is claimed is:

1. An integrated circuit package structure, comprising:
    a substrate having a second surface and a first surface for mounting an integrated circuit chip, wherein the integrated circuit chip has a first region and a second region, and the integrated circuit chip generates more heat in the first region than in the second region;
    a plurality of ball pins disposed on the second surface of the substrate; and
    a power ring disposed on the first surface of the substrate and around the integrated circuit chip, wherein the power ring is electrically connected to the integrated circuit chip via a plurality of power wires, and the power ring has a larger surface area adjacent to the first region while the power ring has a smaller surface area adjacent to the second region.

2. The integrated circuit package structure of claim 1, wherein the power ring is further electrically connected to the ball pins via a plurality of metal plugs through the substrate.

3. The integrated circuit package structure of claim 1, wherein the power ring is consisted of a plurality of blocks without linking to each other, and the surface area of parts of the blocks neighboring the first region is larger than the surface area of other parts of the blocks neighboring the second region.

4. The integrated circuit package structure of claim 1, wherein the integrated circuit chip is a core logic chip.

5. The integrated circuit package structure of claim 1, wherein a heat-dissipating metal upper cap covers top of the substrate and the integrated circuit chip.

6. The integrated circuit package structure of claim 5, wherein the heat-dissipating metal upper cap is composed of aluminum metal.

7. The integrated circuit package structure of claim 1, wherein the substrate is electrically connected to a multi-layer circuit board via the ball pins.

8. The integrated circuit package structure of claim 7, wherein the multi-layer circuit board comprises an isoelectric conducting layer and a plurality of through holes, and the ball pins electrically connects to the isoelectric conducting layer of the multi-layer circuit board through the through holes, and the heat generated by the integrated circuit chip is dissipated via said isoelectric conducting layer.

9. The integrated circuit package structure of claim 8, wherein the isoelectric conducting layer is a power layer or a ground layer.

10. The integrated circuit package structure of claim 7, wherein the multi-layer circuit board is a computer motherboard.

11. An integrated circuit package structure, comprising:
  a substrate having a first surface provided for mounting an integrated circuit chip;
  a plurality of pins disposed on a second surface of the substrate;
  a power ring disposed on the first surface of the substrate and around the integrated circuit chip, wherein the power ring is electrically connected to the integrated circuit chip, and the power ring is further electrically connected to the substrate for heat dissipating; and
  a heat-dissipating metal upper cap disposed on top of the integrated circuit chip, having a first cap surface facing the integrated circuit chip, forming a space between the heat-dissipating metal upper cap and the integrated circuit chip, and having a second cap surface for dissipating heat contacting external air.

12. The integrated circuit package structure of claim 11 wherein the integrated circuit chip has a first region and a second region, the integrated circuit chip generates more heat in the first region than in the second region, the power ring is consisted of a plurality of blocks without linking to each other, and the surface area of parts of the blocks neighboring the first region is larger than the surface area of other arts of the blocks neighboring the second region.

13. The integrated circuit package structure of claim 11, further comprising a plurality of ball pins disposed on a second surface of the substrate.

14. The integrated circuit package structure of claim 11, wherein the power ring is electrically connected to the chip via a plurality of power wires, the power ring is further electrically connected to the ball pins via a plurality of metal plugs through the substrate.

15. The integrated circuit package structure of claim 11, wherein the heat-dissipating metal upper cap is composed of aluminum metal.

16. The integrated circuit package structure of claim 11, wherein the integrated circuit chip is a core logic chip.

17. The integrated circuit package structure of claim 11, wherein the integrated circuit chip has a first region and a second region, the integrated circuit chip generates more heat in the first region than in the second region, and the power ring has a larger surface area adjacent to the first region while the power ring has a smaller surface area adjacent to the second region so as to enhance the heat-dissipation efficiency of the substrate and the integrated circuit chip.

18. The integrated circuit package structure of claim 11, wherein the substrate is electrically connected to a multi-layer circuit board via a plurality of pins.

19. The integrated circuit package structure of claim 18, wherein the multi-player circuit board comprises conducting layer and a plurality of through holes, and the pins are electrically connected to the isoelectric conducting layer via the through holes, and the heat generated by the integrated circuit chip is dissipated via the isoelectric conducting layer.

20. The integrated circuit package structure of claim 19, wherein the isoelectric conducting layer is a power or a ground layer.

* * * * *